(12) United States Patent
Syu et al.

(10) Patent No.: US 7,786,749 B1
(45) Date of Patent: Aug. 31, 2010

(54) PROGRAMMABLE INTEGRATED CIRCUIT HAVING BUILT IN TEST CIRCUIT

(75) Inventors: Tsung-Lu Syu, Fremont, CA (US); Wilson Kaming Yee, Pleasanton, CA (US)

(73) Assignee: Sillcon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 12/468,762

(22) Filed: May 19, 2009

(51) Int. Cl.
*H03K 19/00* (2006.01)
*H03K 19/173* (2006.01)
*H01L 25/00* (2006.01)

(52) U.S. Cl. .............................. 326/16; 326/41; 326/46
(58) Field of Classification Search ................... 326/16, 326/38–41, 46, 47
See application file for complete search history.

(56) References Cited

U.S. PATENT DOCUMENTS

| | | |
|---|---|---|
| RE34,363 E | 8/1993 | Freeman |
| 6,239,611 B1 * | 5/2001 | Matera ......................... 326/16 |
| 6,529,040 B1 * | 3/2003 | Carberry et al. ............... 326/40 |

* cited by examiner

*Primary Examiner*—Daniel D Chang
(74) *Attorney, Agent, or Firm*—DLA Piper LLP (US)

(57) ABSTRACT

A programmable integrated circuit has a plurality of logic elements with each logic element having a plurality of input leads and at least one output lead. The programmable integrated circuit further comprises a group of interconnect lines, and a first set of programmable circuits for electrically connecting the input and output leads of the plurality of logic elements to each other through the group of interconnect lines. The programmable integrated circuit further comprises a test circuit having at least one input and one output. Further the programmable integrated circuit comprises a second set of programmable circuits for electrically connecting the one output of the test circuit to the plurality of input leads of each of the plurality of logic elements and for electrically connecting the at least one output lead of each of the plurality of logic elements to the one input of the test circuit, through the group of interconnect lines.

19 Claims, 6 Drawing Sheets

PROGRAMMABLE INTEGRATED CIRCUIT HAVING BUILT IN TEST CIRCUIT

TECHNICAL FIELD

The present invention relates to a programmable integrated circuit having a built in test circuit to reduce the test time of the programmable integrated circuit.

BACKGROUND OF THE INVENTION

Programmable integrated circuit devices are well known in the art. See for example U.S. Pat. No. Re 34,363, whose disclosure is incorporated herein by reference in its entirety. Such devices can be programmed at the factory or in the field. In the case of the latter, they can be referred to as FPGA (Field Programmable Gate Array). Typically, they comprise an array of logic elements, each of which can be programmed to perform a particular logical function. In addition, a plurality of interconnect lines surround the plurality of logic elements. Each of the logic elements may be programmably connected to the plurality of interconnect lines. In addition, the interconnect lines may be programmably routed to supply signals to different logic elements.

Referring to FIG. 1 there is shown a block level diagram of a programmable integrated circuit device 10 of the prior art, as disclosed in U.S. Pat. No. Re 34,363. The device 10 comprises an array of logic elements 12 arranged in a plurality of rows and columns. Each of the logic elements 12 can be programmed to perform a particular logic function, such as AND OR or other logic functions. Each row of logic elements 12 is separated from one another, and each column of logic elements 12 is also separated from one another. Between the separation of the rows of logic elements 12 and the columns of logic elements 12 is a group of interconnect lines 14. The group of interconnect lines 14 comprises a plurality of lines 14. The group of lines 14 pass through a plurality of switches 16, which are also arranged in a plurality of rows and columns. Each of the switches 16 routes the connection of the interconnect lines from rows to columns or vice-versa. The group of interconnect lines 14 are also connected to a plurality of connection boxes 18. Each of the connection boxes 18 connects one or more of the group of interconnect lines 14 to an associated logic element 16.

Each of the logic element 12 has a plurality of input leads, which are connected to the group of interconnect lines 14, through an associated connection box 18. Further, each of the logic element 12 has at least one output lead, which is also connected to the group of interconnect lines 14 through an associated connection box 18. In this manner, the logic function of each logic element 12 can be changed, as well as the routing of the signals to/from each logic element 12 to other logic elements 12 can be changed.

Referring to FIG. 2 there is shown in greater detail a portion of the device 10 shown in FIG. 1. In particular, FIG. 2 shows in greater detail the group of interconnect lines 14 as comprising a plurality of lines 14, connected to a switch 16 and to a connection box 18 and to a logic element 12.

Referring to FIG. 3 there is shown in greater detail a circuit diagram of a common component of a logic element 12 in the nature of a Look-up Table (LUT). Another common component of a logic element is a D-flipflop (not shown). A plurality of input leads 21 is shown, connected to the logic element 12. The input leads 21 are "decoded" by logic gates 22. The resulting signals are used to select one of the memory elements 20 to be programmably connected to output lead 24. As previously discussed, the input leads 21 and the output lead 24 are connected to the group of interconnect lines 14, so that the signals on those input/output leads 21/24 can be routed to other logic elements 12. The set of memory elements 20 are used to configurable the LUT to the desired function. Typically, these memory elements may be SRAM cells or non-volatile cells like Flash or fuses. A logic element 12 may contain one or more LUTs and one or more D-flip-flops.

The problem with the device 10 is that as the scale of integration increases, more and more logic elements 12 can be fabricated on a single integrated circuit die. For example, in 1990, a single programmable logic device may contain hundreds of LUTs, whereas it is possible today to integrate hundreds of thousand LUTs in a single die. As the number of LUTs are placed on a single integrated die increases, the testing of each of the logic elements 12 becomes increasingly time consuming. While it is very probable that not all gates or logic elements 12 will be used, once the device 10 is manufactured, nevertheless, the manufacturer of the device 10 must test each and every gate or logic element 12. Thus, increasingly, testing has become a larger cost portion of the fabrication of the device 10.

More importantly, much of the test time associated with logic elements 12 is the time it takes to write new information into the memory cells 20. For memory cells 20 that have very long write times, such as Flash memory cells, the test time will be proportionally long.

It is, therefore, an object of the present invention to reduce the test time of an integrated circuit device having a plurality of programmable logic elements.

SUMMARY OF THE INVENTION

In the present invention, a programmable integrated circuit comprises a plurality of logic elements with each logic element having a plurality of input leads and at least one output lead. The programmable integrated circuit further comprises a group of interconnect lines, and a first set of programmable circuits for electrically connecting the input and output leads of the plurality of logic elements to each other through the group of interconnect lines. The programmable integrated circuit further comprises a test circuit having at least one input and one output. Further the programmable integrated circuit comprises a second set of programmable circuits for electrically connecting the one output of the test circuit to the plurality of input leads of each of the plurality of logic elements and for electrically connecting the at least one output lead of each of the plurality of logic elements to the one input of the test circuit, through the group of interconnect lines.

DETAILED DESCRIPTION OF THE PREFERRED EMBODIMENT

Figure 1:
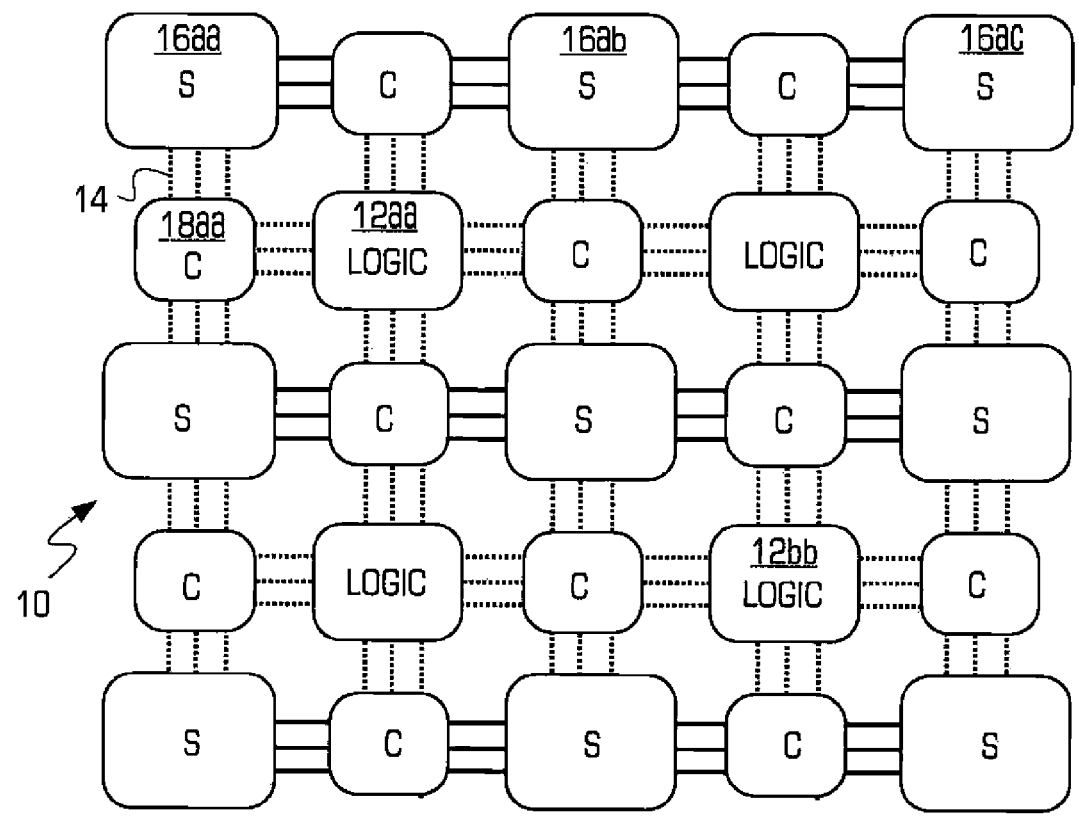
FIG. 1 block level diagram of a programmable integrated circuit device of the prior art.
Figure 2:
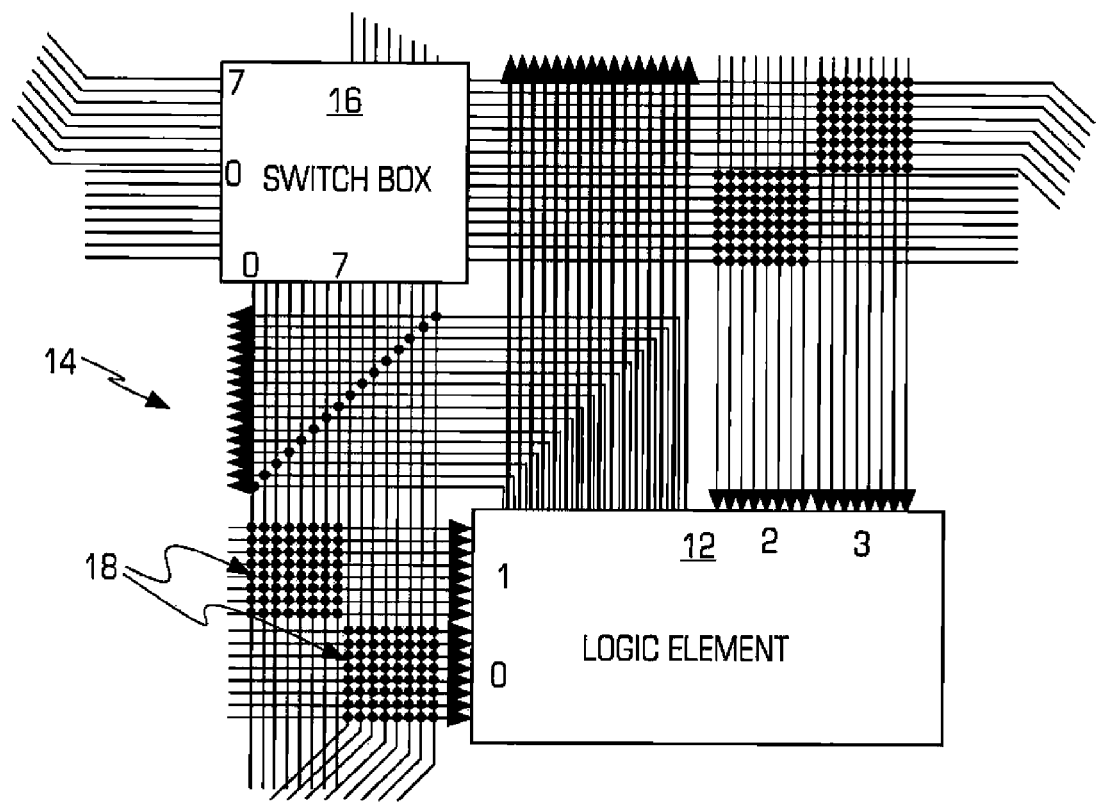
FIG. 2 detailed block level diagram of a portion of the programmable integrated circuit device shown in FIG. 1, showing the switch box for routing the interconnect lines and the connection element for connecting the interconnect lines to the input/output leads of a logic element.
Figure 3:
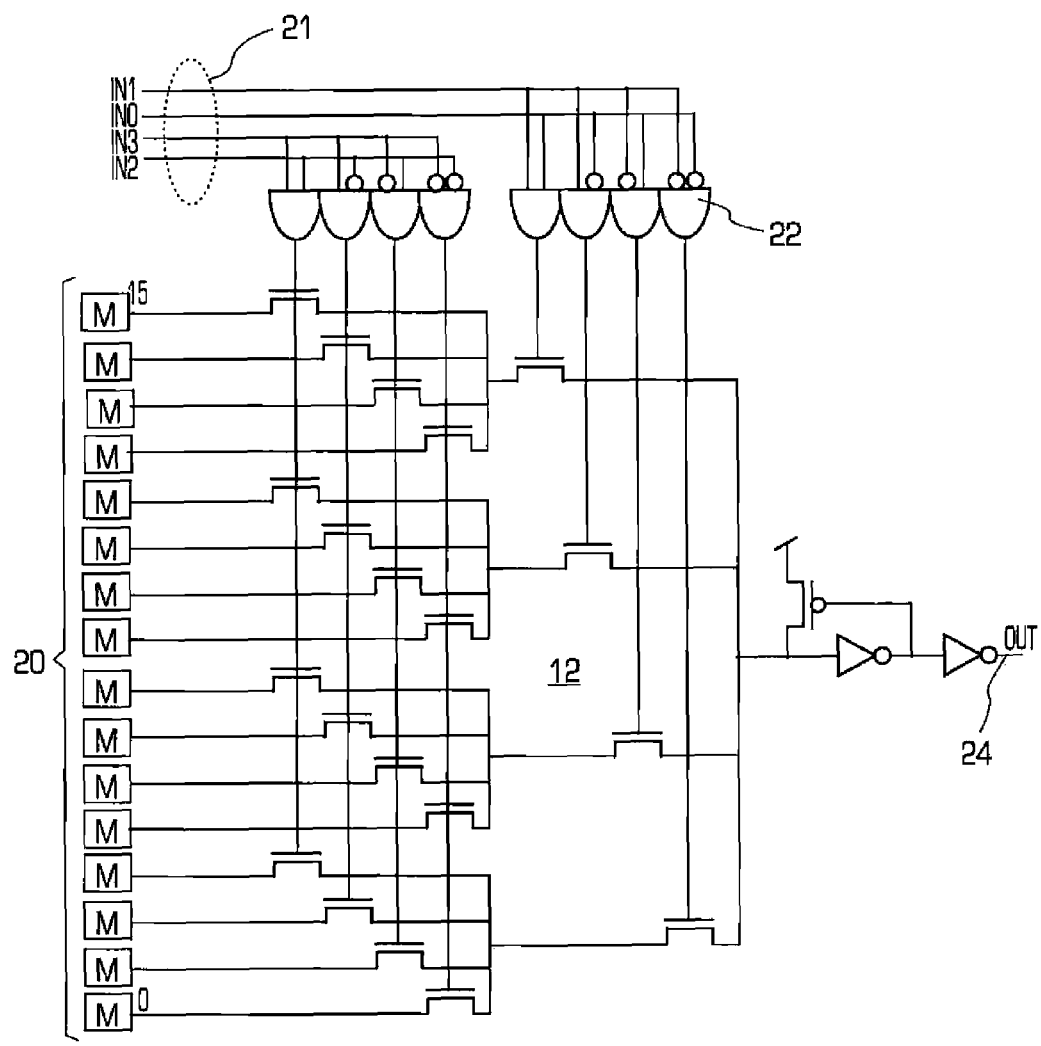
FIG. 3 is a detailed circuit diagram of an example of a look up table (LUT), a common component of a logic element that can be used in the programmable integrated circuit device of FIG. 1.
Figure 4:
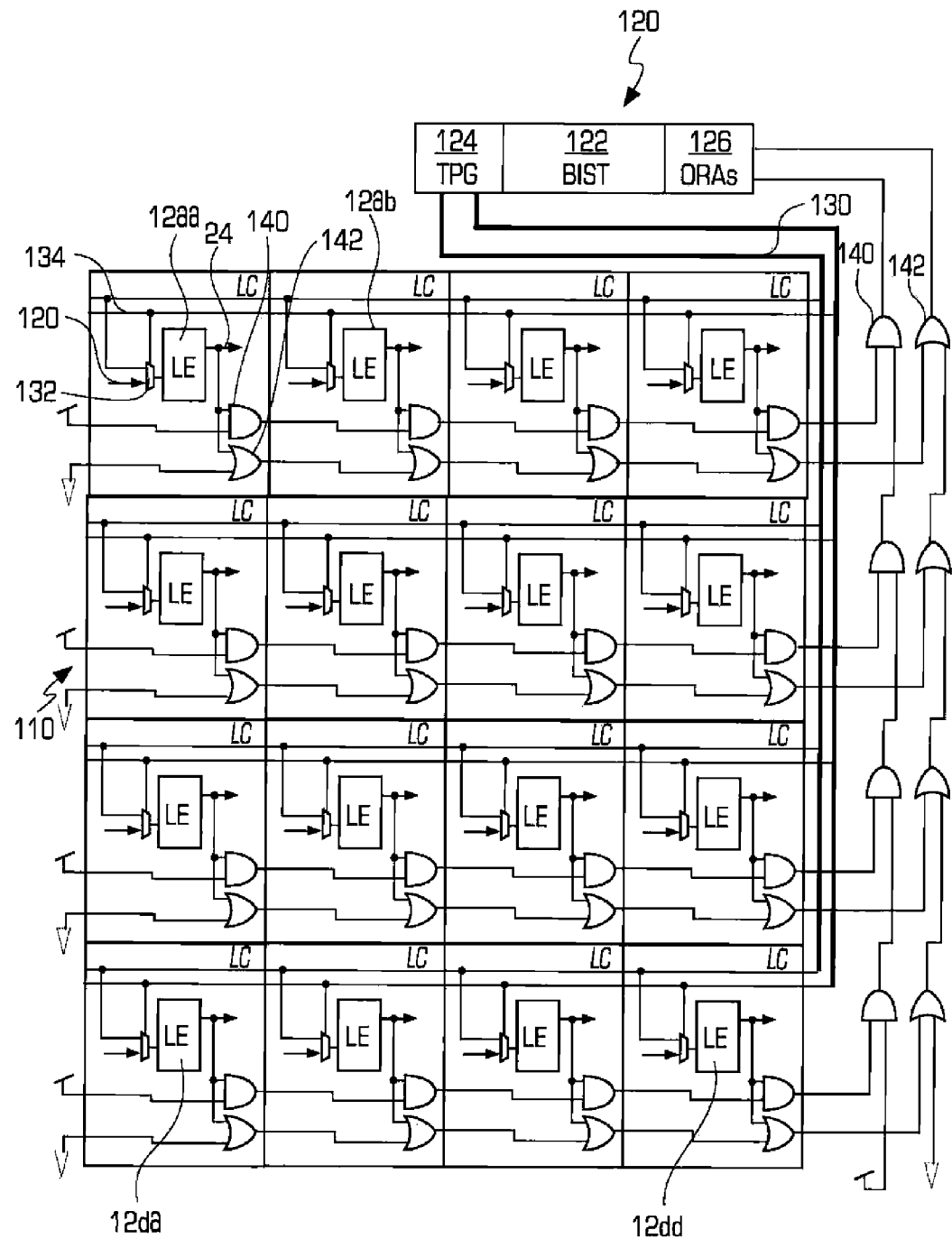
FIG. 4 is a block level diagram of a programmable integrated circuit device of the present invention.

Referring to FIG. 4 there is shown a block level diagram of an integrated circuit device 110 of the present invention. The device 110 comprises an array of logic elements 12 arranged in a plurality of rows and columns. Each of the logic elements 12 can be programmed to perform a particular logic function, such as AND, OR or other logic functions. Each row of logic elements 12 is separated from one another, and each column of logic elements 12 is also separated from one another. Between the separation of the rows of logic elements 12 and the columns of logic elements 12 is a group of interconnect lines 14 (not shown). The group of interconnect lines 14 comprises a plurality of lines 14. The group of lines 14 pass through a plurality of switches 16 (not shown), which are also arranged in a plurality of rows and columns. Each of the switches 16 routes the connection of the interconnect lines from rows to columns or vice-versa. The group of interconnect lines 14 are also connected to a plurality of connection boxes 18 (not shown). Each of the connection boxes 18 connects one or more of the group of interconnect lines 14 to an associated logic element 16. Thus far, all of the foregoing described elements are shown and described in FIG. 1, and in U.S. Pat. No. Re 34,363, whose disclosure is incorporated herein by reference in its entirety.

The device 110 further comprises a testing circuit 120, which comprises a built-in testing circuit 122, whose output is connected to a test pattern generator circuit 124. Finally, the testing circuit 120 also comprises an Output Response Analyzer circuit 126 which receives the output from each of the logic elements 12. The test pattern generator circuit 124 generates a series or plurality of test signals. The test signals are supplied to a plurality of lines 130, which in the preferred embodiment is the same as the group of interconnect lines 14 for the device 110 to connect the logic elements 12. Alternatively, the group of lines 130 to which the test signals from the test pattern generator circuit 124 is connected may be a group of lines different from the group of interconnect lines 14. In any event, the lines 130 are supplied to all of inputs of the logic elements 12.

In the preferred embodiment, each of the logic elements 12 further comprises a multiplexer 132 to each of the LUT components. Each of the multiplexer 132 has two groups of inputs: a first group to receive the inputs 120 that are otherwise connected to the memory cells 20 and the second group of input to the multiplexer 132 is connected to the lines 130. One of the lines 134 from lines 130 is used to control the multiplexer 132, i.e. to either switch the multiplexer 132 so that the test signals from the test pattern generator circuit 124 is connected to the inputs of the logic element 12 or the signals from the memory cells 20 are supplied to the inputs to the logic element 12.

Each of the logic elements 12, as described heretofore, outputs at least one signal along the output 24, which is supplied to the group of interconnect lines 14. However, from each logic element 12, the output 24 is also supplied to the input of an AND gate 140 and to the input of an OR gate 142. The plurality of AND gates 140 from each of the logic elements 12 are connected in series. Thus, the output of an AND gate 140 from one logic element 12 is supplied as an input to an adjacent AND gate 140, with the other input to that AND gate 140 from the output 24 of that associated logic element 12. In this manner all of the AND gates 140 are connected serially in a string like configuration. The input to the first AND gate 140 is connected to a high voltage. Thus, if the output 24 of the logic element 12aa for the first AND gate 140 is high, the output of the AND gate 140 for the logic element 12aa will also be high. In this manner if the outputs 24 of all of the logic elements 12 are high, then the output of the last AND gate 140 in the string will also be high. However, if one of the logic elements 12 outputs a low output 24, indicating a failure, then the string of AND gates 12 will also be low.

The output 24 of each logic element 12 is also connected to the input of an OR gate 142. Similar to the connection of the output 24 to the AND gates 140, the plurality of OR gates 142 from each of the logic elements 12 are connected in series. Thus, the output of an OR gate 142 from one logic element 12 is supplied as an input to an adjacent OR gate 142, with the other input to that OR gate 142 from the output 24 of that associated logic element 12. In this manner all of the OR gates 142 are connected serially in a string like configuration. The input to the first OR gate 142 is connected to a low voltage. Thus, if the output 24 of the logic element 12aa for the first OR gate 142 is low, the output of the OR gate 142 for the logic element 12aa will also be low. In this manner if the outputs 24 of all of the logic elements 12 are low, then the output of the last OR gate 142 in the string will also be low. However, if one of the logic elements 12 outputs a high output 24, indicating a failure, then the string of OR gates 142 will be high.

Thus, by supplying the same test signal to all of the logic elements 12 of the device 110, all of the logic elements 12 of the device 110 can be tested simultaneously, with the need to check only one signal.

If a logic element 12 has multiple outputs 24, then multiple AND and OR gate chains can be used to implement the same function described earlier.

Figure 5:
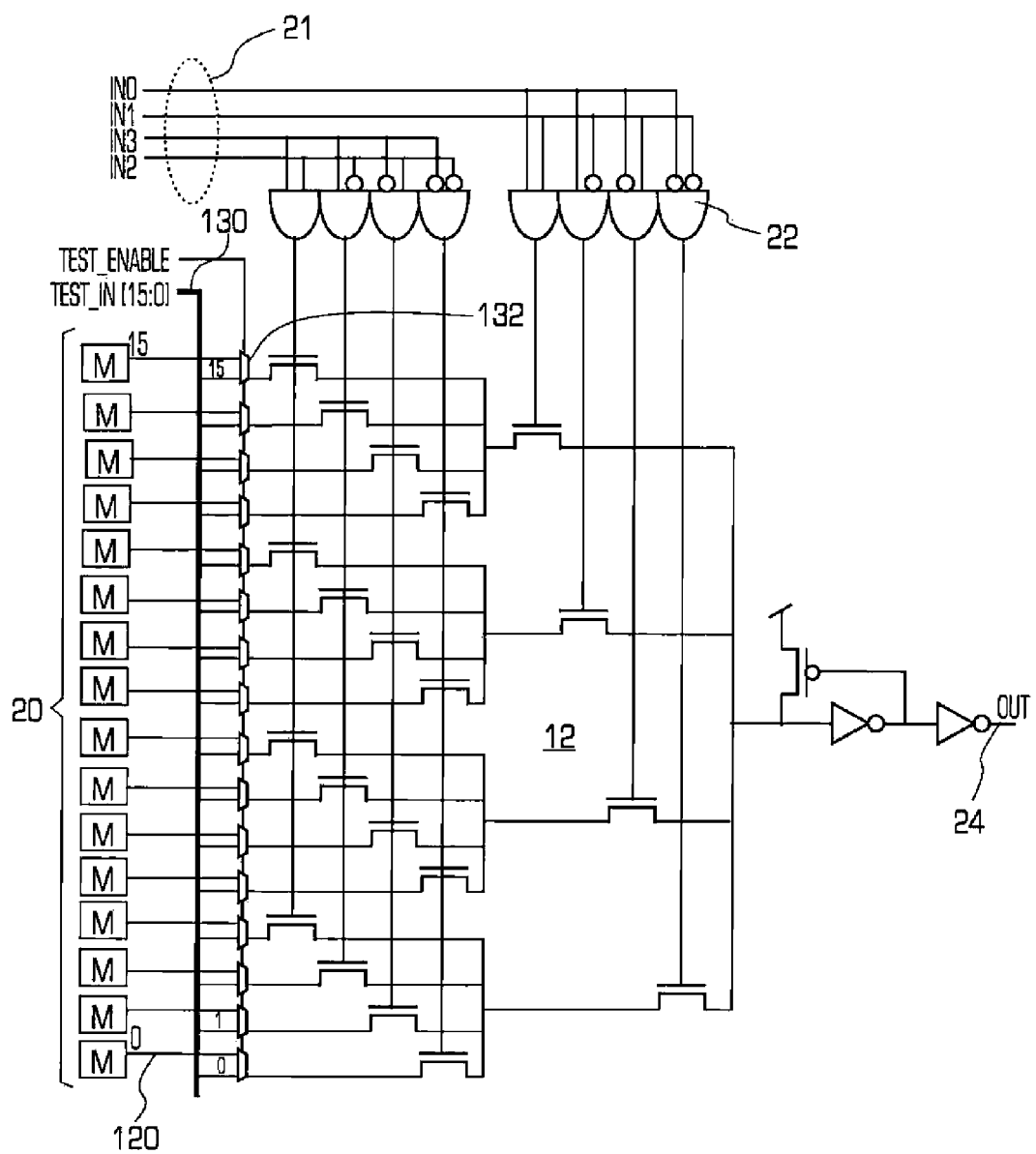
FIG. 5 is a detailed circuit diagram of a first example of a look up table, a common component of a logic element that can be used in the programmable integrated circuit device of the present invention shown in FIG. 4.

Referring to FIG. 5, there is shown a detailed circuit diagram of the Look-up Table component of logic element 12 portion of the device 110 of the present invention. The test signals supplied on the lines 130 are supplied to the multiplexers 132 to which the memory cell outputs 20 are also supplied. The output of each multiplexer 132 is then supplied to the logic element 12 for further processing in accordance with the logic circuit 22.

Figure 6:
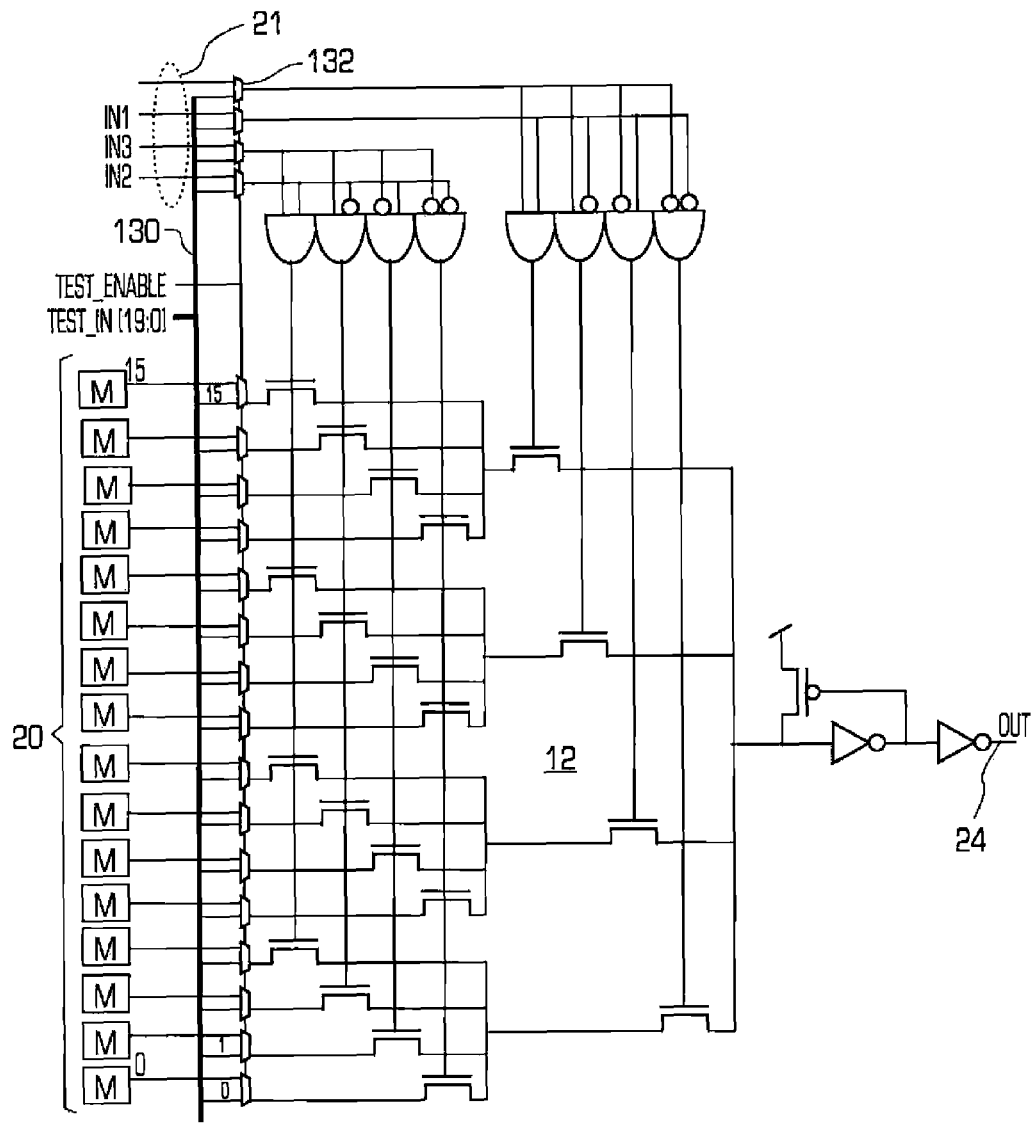
FIG. 6 is a detailed circuit diagram of a second example of a look up table, a common component of a logic element that can be used in the programmable integrated circuit device of the present invention shown in FIG. 4.

Referring to FIG. 6, there is shown a detailed circuit diagram of another embodiment of Look-up Table component of the logic element 12 portion of the device 110 of the present invention. The embodiment shown in FIG. 6 is similar to the embodiment shown in FIG. 5. The lines 130 from the test pattern generator 124 are supplied to the inputs of the multiplexer 132 to which inputs to the logic circuits 22 are also supplied. In addition, the line that controls each of the multiplexers 132 for controlling the switching of the input signals to the logic element 12 also controls the multiplexers 132 that control the supplying of the signals 21 from the Connection Box 18 to the LUT. The enhancement allows the application of test signals 130 to all input signals of the LUT.

Figure 7:
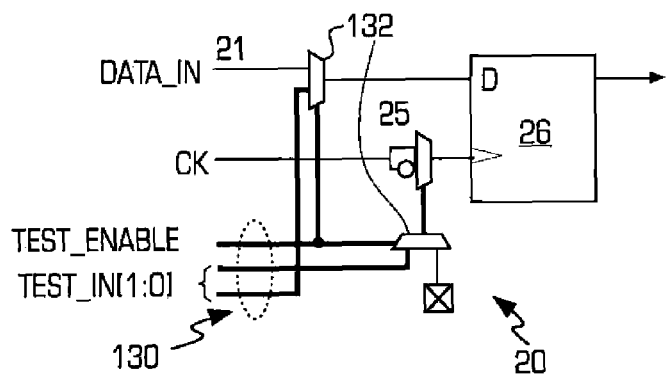
FIG. 7 is a detailed circuit diagram of a D-flipflop, another common component of a logic element that can be used in the programmable integrated circuit device of the present invention shown in FIG. 4.

Referring to FIG. 7 there is shown a D-flipflop 26, another common components of the logic element 12. The data input to D-flipflop 26 comes from the Connection Box 18 via signal 21. The polarity of the clock input is programmable by memory cell 20 via multiplexer 25. To enhance test time of the D-flipflop 26, multiplexers 132 are added to allow test signals 130 to replace the normal input signals 21 and signals from memory cell 20. FIG. 7 illustrates another application of the same apparatus described in FIG. 5 and FIG. 6.

From the foregoing it is seen that although a test circuit 120 is provided in the same integrated circuit die as the integrated circuit device 110, thereby using up precious semiconductor "real estate", the addition of the testing circuit 120 actually reduces the cost of the integrated circuit die 110 because testing time is reduced.

What is claimed is:

1. An integrated circuit device comprising:
   a plurality of logic elements, each logic element having a plurality of input leads and at least one output lead, and having a programmable circuit to cause said logic element to perform a selected logic function;
   a group of interconnect lines;
   a first programmable connection circuit for programmably connecting each of said input leads of a logic element to at least one of said group of interconnect lines, and for programmably connecting said at least one output lead of a logic element to at least one of said group of interconnect lines;
   a programmable switch circuit for programmably connecting each of said interconnect lines to at least one other of said interconnect lines;
   whereby each of said logic elements can be programmed to perform a selected one of a plurality of logic functions, and said logic elements can be connected to each other in a selectable manner;
   a testing circuit for generating at least one test signal and having a plurality of output leads and for receiving at least one input lead;
   a second programmable connection circuit for programmably connecting each of said output leads of the testing circuit to each of said input leads of each logic element, and for programmably connecting said at least one output lead of each logic element to at least one input lead of said test circuit; and
   a plurality of AND gates connected in series having a first end and a second end, with each AND gate having at least two inputs and one output, with one of the two inputs of an AND gate connected to receive an output lead of a different logic element, and with the second input of each AND gate, except for the AND gate at the first end, connected to receive the output of an adjacent AND gate in the series, with the second input of the AND gate at the first end connected to a high voltage source, and with the output of the AND gate at the second end connected to the testing circuit;
   whereby each of said logic elements can be tested by the testing circuit.

2. The integrated circuit device of claim 1 wherein said testing circuit further comprises:
   a test pattern generator circuit for generating a plurality of different test signals supplied on said output leads.

3. The integrated circuit device of claim 2 wherein said testing circuit further comprises:
   a response analyzer circuit for analyzing signals received on said at least input lead connected to said plurality of logic elements.

4. The integrated circuit device of claim 1 wherein said programmable switch circuit for programmably connecting each of said interconnect lines to at least one other of said interconnect lines comprises a non-volatile transistor.

5. The integrated circuit device of claim 4 wherein said non-volatile transistor is a split gate floating gate transistor.

6. The integrated circuit device of claim 1 wherein said programmable circuit in each logic element to cause said logic element to perform a selected logic function comprises transistors.

7. The integrated circuit device of claim 6 wherein said programmable circuit further comprises a plurality of memory cells controlling said transistors.

8. The integrated circuit device of claim 7 wherein said plurality of memory cells form at least a part of a shift register, with control signals loaded into said memory cells by being transferred through said shift register until each of said control signals is located in said memory cells.

9. The integrated circuit device of claim 1 wherein said plurality of logic elements are arranged in an array.

10. A programmable integrated circuit comprising:
    a plurality of logic elements, each logic element having a plurality of input leads and at least one output lead;
    a group of interconnect lines;
    a first set of programmable circuits for electrically connecting said input and output leads of said plurality of logic elements to each other through said group of interconnect lines;
    a test circuit having at least one input and one output;
    a second set of programmable circuits for electrically connecting said one output of said test circuit to the plurality of input leads of each of said plurality of logic elements and for connecting said at least one output lead of each of said plurality of logic elements to said one input of said test circuit, through said group of interconnect lines; and
    a plurality of OR gates connected in series having a first end and a second end, with each OR gate having at least two inputs and one output, with one of the two inputs of an OR gate connected to receive an output lead of a different logic element, and with the second input of each OR gate, except for the OR gate at the first end, connected to receive the output of an adjacent OR gate in the series, with the second input of the OR gate at the first end connected to a low voltage source, and with the output of the OR gate at the second end connected to the test circuit.

11. The programmable integrated circuit of claim 10 wherein said test circuit further comprises:
    a test pattern generator circuit for generating a plurality of different test signals supplied on said one output.

12. The programmable integrated circuit of claim 11 wherein said test circuit further comprises:
    a response analyzer circuit for analyzing signals received on said at least input connected to said at least one output lead of each of said plurality of logic elements.

13. The programmable integrated circuit of claim 10 wherein said first set of programmable circuits programmably connects each of said interconnect lines to at least one other of said interconnect lines.

14. The programmable integrated circuit of claim 13 wherein said first set of programmable circuits comprises a non-volatile memory transistor.

15. The programmable integrated circuit of claim 10 wherein each of said logic elements comprises a programming circuit to cause said logic element to perform a selected logic function.

16. The programmable integrated circuit of claim 15 wherein said programming circuit further comprises a plurality of transistors, and a plurality of memory cells each memory cell controlling a corresponding transistor.

17. The programmable integrated circuit of claim 16 wherein said plurality of memory cells form at least a part of a shift register, with control signals loaded into said memory cells by being transferred through said shift register until each of said control signals is located in said memory cells.

18. The programmable integrated circuit of claim 10 wherein said plurality of logic elements are arranged in an array.

19. A programmable integrated circuit comprising:

a plurality of logic elements, each logic element having a plurality of input leads and at least one output lead, arranged in an array having a plurality of rows and a plurality of columns;

a group of interconnect lines, programmably connected to the plurality of input leads of each of said logic elements and programmably connected to at least one output lead of each of said logic elements, said group of interconnect lines arranged between rows of logic elements and between columns of logic elements;

a first set of programmable circuits for electrically routing signals supplied on said group of interconnect lines to various logic elements;

a test circuit having at least one input and one output;

a second set of programmable circuits for electrically connecting said one output of said test circuit to the plurality of input leads of each of said plurality of logic elements and for connecting said at least one output lead of each of said plurality of logic elements to said one input of said test circuit, through said group of interconnect lines;

a plurality of AND gates connected in series having a first end and a second end, with each AND gate having at least two inputs and one output, with one of the two inputs of an AND gate connected to receive an output lead of a different logic element, and with the second input of each AND gate, except for the AND gate at the first end, connected to receive the output of an adjacent AND gate in the series, with the second input of the AND gate at the first end connected to a high voltage source, and with the output of the AND gate at the second end connected to the test circuit; and a plurality of OR gates connected in series having a first end and a second end, with each OR gate having at least two inputs and one output, with one of the two inputs of an OR gate connected to receive an output lead of a different logic element, and with the second input of each OR gate, except for the OR gate at the first end, connected to receive the output of an adjacent OR gate in the series, with the second input of the OR gate at the first end connected to a low voltage source, and with the output of the OR gate at the second end connected to the test circuit.

* * * * *